(12) United States Patent
Agostini et al.

(10) Patent No.: US 11,197,392 B2
(45) Date of Patent: Dec. 7, 2021

(54) METHOD OF FORMING A 3D-VAPOR CHAMBER

(71) Applicant: ABB Schweiz AG, Baden (CH)

(72) Inventors: Bruno Agostini, Zürich (CH); Daniele Torresin, Baden (CH); Matteo Bortolato, Zürich (CH)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 16/834,600

(22) Filed: Mar. 30, 2020

(65) Prior Publication Data

US 2020/0315064 A1    Oct. 1, 2020

(30) Foreign Application Priority Data

Mar. 28, 2019 (EP) .................. 19165849

(51) Int. Cl.
| | | |
|---|---|---|
| *B23K 26/21* | (2014.01) | |
| *H05K 7/20* | (2006.01) | |
| *F28D 15/02* | (2006.01) | |
| *B23P 15/26* | (2006.01) | |

(52) U.S. Cl.
CPC .......... *H05K 7/20309* (2013.01); *B23K 26/21* (2015.10); *F28D 15/0266* (2013.01); *H05K 7/20336* (2013.01); *B23P 15/26* (2013.01); *F28D 15/0275* (2013.01); *Y10T 29/49353* (2015.01)

(58) Field of Classification Search
CPC ........... H05K 7/20309; H05K 7/20336; B23K 26/21; B23P 15/26; Y10T 29/49353; F28D 15/0266; F28D 15/0233; F28D 15/046; F28D 15/0275; F28F 9/001
See application file for complete search history.

(56) References Cited

U.S. PATENT DOCUMENTS

| | | | |
|---|---|---|---|
| 4,196,504 A * | 4/1980 | Eastman | B23P 15/26 |
| | | | 165/104.26 |
| 7,484,553 B2 * | 2/2009 | Lai | F28D 15/0233 |
| | | | 165/104.26 |
| 7,543,630 B2 * | 6/2009 | Lai | F28D 15/0233 |
| | | | 165/104.26 |
| 9,162,392 B2 | 10/2015 | Grebe et al. | |
| 9,618,275 B1 * | 4/2017 | Anderson | F28D 15/046 |
| 9,897,393 B2 * | 2/2018 | Lan | F28D 15/0266 |
| 10,371,458 B2 * | 8/2019 | Sun | F28D 15/0233 |
| 10,483,190 B2 * | 11/2019 | Lin | H01L 21/4882 |
| 10,935,326 B2 * | 3/2021 | Sun | F28F 9/0075 |
| 2005/0173098 A1 | 8/2005 | Connors | |
| 2007/0272399 A1 | 11/2007 | Nitta et al. | |

(Continued)

FOREIGN PATENT DOCUMENTS

| | | |
|---|---|---|
| CN | 106052435 A | 10/2016 |
| JP | 2013091316 A | 5/2013 |
| KR | 20100036521 A | 4/2010 |

*Primary Examiner* — Ryan J. Walters
(74) *Attorney, Agent, or Firm* — Greenberg Traurig, LLP

(57) ABSTRACT

The invention relates to a method which is suited for manufacturing a 3D-vapor chamber in a defined and efficient manner. Especially, the present method provides a solution for providing a vapor chamber having an evaporator and a condenser made from a first part and a second part, wherein continuity of internal structures is given which in turn provides an efficient working behaviour of the vapor chamber.

19 Claims, 6 Drawing Sheets

(56) References Cited

U.S. PATENT DOCUMENTS

| | | | |
|---|---|---|---|
| 2014/0060781 A1* | 3/2014 | Jia | F28D 15/0275 165/104.26 |
| 2016/0348985 A1 | 12/2016 | Sun et al. | |
| 2017/0227298 A1 | 8/2017 | Sun et al. | |
| 2017/0314873 A1 | 11/2017 | Lin et al. | |
| 2017/0343295 A1* | 11/2017 | Lan | F28F 9/013 |
| 2017/0343297 A1* | 11/2017 | Lan | F28D 15/046 |

* cited by examiner

METHOD OF FORMING A 3D-VAPOR CHAMBER

TECHNICAL FIELD

The invention relates to a method for forming a 3D-vapor chamber and thus a vapor chamber having an evaporator and a condenser. The invention further relates to a vapor chamber which is formed by such a method.

BACKGROUND ART

Vapor chambers are known in the art. Such vapor chambers are used for dissipating energy such as from electronic parts. Additionally to two-dimensional vapor chambers, so-called three-dimensional vapor chambers are known which comprise an evaporator and a condenser. Within the vapor chamber, often a capillary structure is provided additionally to an inner volume, so that water vapor which is present in the inner volume may condense and may be guided through the capillary structure.

A three-dimensional vapor chamber must ensure that there is no discontinuity of the capillary structure, i.e. the capillary structure, between the evaporator, which might be a horizontal part, and the condenser, which might be a vertical part. Indeed, the liquid coming back from the condenser must be allowed to spread horizontally in the evaporator rather than falling vertically under the effect of gravity.

The standard way of forming a three-dimensional vapor chamber is to assemble it directly in the three-dimensional shape with a capillary structure running from the sides to the top to ensure the continuity of the capillary pumping. There are also internal pourous coated pillars to ensure structural strength and local distribution of liquid. However this manufacturing process is rather complex and limits the number of suppliers. It also limits the type of usable air fins to low performance flat fins.

CN 106052435 A describes a worm-type feed supply device comprising a heat radiating module, wherein the heat radiating module comprises a cooling fan, a heat radiator and a vapor chamber. The vapor chamber comprises an upper copper plate, a lower copper plate, an upper copper powder sintering layer, a lower copper powder sintering layer, solid hexagonal copper cylinders and copper powder rings, wherein the upper copper powder sintering layer is sintered on the lower surface of the upper copper plate, the lower copper powder sintering layer is sintered on the upper surface of the lower copper plate, and the plurality of solid hexagonal copper cylinders are arranged at intervals on the lower copper plate, are connected through copper bars and are wrapped by the copper powder rings. The cross section of each heat radiating fin is symmetrically spindle-shaped, one edge of each heat radiating fin is scalloped, the other edge of each heat radiating fin is sawtoothed, and the surface of each heat radiating fin is provided with ceramic particles through laser cladding.

JP 2013-091316 A describes a device for laminated production of a three-dimensional object including a construction chamber. The construction chamber comprises a height-adjustable construction platform; an apparatus for dispensing on the platform, a material layer solidifiable by the action of an electromagnetic ray; and an irradiation unit in the place of a layer corresponding to the object. The irradiation unit includes a radiation source, a control unit, and a lens present in the radiation path of the electromagnetic ray, and has at least one deposition surface present inside or outside the construction chamber.

KR 20100036521 describes a manufacturing device of a metal membrane filter having a nano-structured porous layer including the following: a laser irradiation part consisting of a laser and an optical lens and in which a carrier gas inlet is formed; a sample fixing part in which a metal sample is fixed; an ablation chamber transferring nanoparticle aggregate by carrier gas; a heating chamber sintering the nanoparticle aggregate flowed from the ablation chamber; and a vapor deposition chamber in which a carrier gas outlet is formed and a metal filter is mounted.

However, the above cited references do not give any hint for providing an improved vapor chamber or an improved method of forming the same.

SUMMARY OF INVENTION

It is therefore an object of the invention to provide a method for forming a vapor chamber for dissipating heat from an electronic component which is easy to perform and results in a vapor chamber which is effective in dissipating heat from an electronic component. It is further an object of the present invention to provide a vapor chamber for dissipating heat from an electronic component which is easy to form and which is effective in dissipating heat from an electronic component.

These objects are solved at least in part by a method having the features of independent claim 1. These objects are further solved at least in part by a vapor chamber having the features of independent claim 10. Advantageous embodiments are given in the dependent claims, in the further description as well as in the figures, wherein the described embodiments can, alone or in any combination of the respective embodiments, provide a feature of the present invention unless not clearly excluded.

Described is a method of forming a vapor chamber for dissipating heat from an electronic component, wherein the vapor chamber comprises a first part, wherein the first part forms an evaporator, and wherein the vapor chamber comprises a second part, wherein the second part forms a condenser, wherein the first part is fixed to the second part, and wherein the method comprises the steps of:

a) providing the first part for forming an evaporator, wherein the first part comprises a casing having an interior space in which a capillary structure for guiding liquid water and an inner volume for carrying water vapor is provided, and wherein the casing comprises an opening for connecting the interior space of the first part with an interior space of the second part;

b) providing the second part for forming a condenser, wherein the second part comprises a casing having an interior space in which a capillary structure for guiding liquid water and an inner volume for carrying water vapor is provided, and wherein the casing comprises an opening for connecting the interior space of the first part with the interior space of the second part;

c) connecting the second part to the first part by fixing a connecting element to both the capillary structure of the first part and of the second part, thereby forming a gap between the capillary structure of the first part and the second part;

d) closing the gap between the capillary structure of the first part and of the second part by forming a capillary intermediate structure between the capillary structure of the first part and of the second part; and e) closing the casing of the vapor chamber by connecting the casing of the first part with the casing of the second part by providing a closure.

Such a method for forming a vapor chamber for dissipating heat from an electronic component is easy to perform and results in a vapor chamber which is effective in dissipating heat from an electronic component.

The present method thus is suited for forming a vapor chamber for dissipating heat from an electronic component. A vapor chamber as generally known in the art thus is a device which is capable of dissipating heat from electronic components, such as from electronic circuits or drive products. Generally, a vapor chamber may comprise internal structures in which water may be evaporated in order to remove heat from an adjacent part, such as the electronic component, and in which water may be condensed due to which heat may be transferred from the vapor chamber to external air fins, for example.

According to the present invention, the method deals with forming a so-called 3D-vapor chamber. With this regard, the vapor chamber comprises a first part, wherein the first forms an evaporator. This evaporator serves for evaporating water and thus for cooling an electronic component. Further, the vapor chamber comprises a second part, wherein the second part forms a condenser. The second part thus condenses water and may thus dissipate energy, or heat, respectively, away from the vapor chamber. It is further provided that the first part is fixed to the second part and thus the vapor chamber comprises two parts being fixed to each other.

The method for forming such a vapor chamber comprises the following steps.

According to method step a) the method comprises the step of providing the first part for forming an evaporator, wherein the first part comprises a casing having an interior space in which a capillary structure for guiding liquid water and an inner volume for carrying water vapor is provided, and wherein the casing comprises an opening for connecting the interior space of the first part with an interior space of the second part.

Therefore, the first part is suited for being an evaporator and may thus come into contact with an electronic component which should be cooled. An inner volume may be provided which may be positioned next to the capillary structure. For example, the capillary structure may at least in part embed the inner volume. The inner volume is capable of carrying water vapor which is formed by evaporated water during the cooling step.

This structure is provided in a casing and the casing is provided with an opening in this stage so that the internal structure as described above is opened to the outside of the casing.

Correspondingly and according to method step b), the method comprises the step of providing the second part for forming a condenser, wherein the second part comprises a casing having an interior space in which a capillary structure for guiding liquid water and a inner volume for carrying water vapor is provided, and wherein the casing comprises an opening for connecting the interior space of the first part with the interior space of the second part.

Therefore, the second part may be designed correspondingly as described in more detail above with regard to the first part. However, the internal structure which is suited for evaporating water into water vapor comprises a capillary structure. The capillary structure generally may be a porous structure having continuous pores and may be capable of carrying and thus guiding condensed water through the condenser and from the condenser to the evaporator and further through the evaporator like described in more detail below.

With regard to the first and the second part, it is provided that both the first part and the second part have respective openings in the casing wherein the openings may be adapted for connecting the first part and the second part or in more detail, to connect the internal structure comprising the capillary structure and the inner volume of the first part with the corresponding internal structure of the second part.

According to method step c), the method comprises the step of connecting the second part to the first part by fixing a connecting element to both the capillary structure of the first part and the capillary structure of the second part, thereby forming a gap between the capillary structure of the first part and the second part.

According to this step, the first and the second parts are thus fixed together, which may lead to an arrangement of the first part and the second part, or the evaporator and the condenser, respectively, forming a base structure of a 3D-vapor chamber. This is realized by mechanically connecting the capillary structure of the first part and of the second part and for example of a plurality of capillary structures at least of the first or the second part by fixing a connecting element to the respective capillary structures. By doing this, the capillary structures are not directly connected to each other but a gap between the respective capillary structures is formed. Thus, the connecting element may also have the object of a spacer and/or may be formed as a joining plate, for example.

The connecting element may be porous or non-porous and the connecting element may for example be welded to the capillary structures, such as by using laser welding.

Such a spacer may be important for connecting the capillary structures and thus the capillary structures in a functionally effective manner by introducing a capillary structure in the gap so that water can be transferred from the capillary structures of the first part to the capillary structures of the second part and may be spread in the second part, like described in greater detail below.

Like indicated above, the method comprises according to method step d) the step of closing the gap between the capillary structure of the first part and of the second part by forming a capillary intermediate structure between the capillary structure of the first part and of the second part. This is preferably realized such, that the capillary intermediate structure is adapted to both the capillary structure of the first part as well as of the capillary structure of the second part. In other words and like indicated above, the capillary structures and thus the capillary structures of the respective parts are continued so that a functional integration of the capillary intermediate structure is provided such, that condensed water may pass the capillary intermediate structure and may thus be transferred from the capillary structure of the first part to the capillary structure of the second part.

For example, the capillary intermediate structure may be formed on the connecting element.

According to further method step e), the method further comprises the step of closing the casing by connecting the casing of the first part with the casing of the second part by providing a closure. The closure thus preferably hermetically closes the casing so that no water vapor is allowed to leave the casing and no substances are allowed to enter the casing. It may be preferred that the closure is provided on the capillary intermediate structure.

Having closed the casing by providing the closure, the method may generally be finished and the 3D-vapor chamber may be formed.

Of course, introducing water into the casing may follow or may be performed at an earlier step.

Such a method is advantageous over the prior art.

In fact, it was found that it is a promising manufacturing method to start from two separate parts and to connect these parts to each other. This allows a production starting from well available parts, i.e. the first and the second parts, which might be conventional 2D-vapor chambers.

Therefore, at least one of step a) and step b) may be performed by providing an opening in a two-dimensional vapor chamber.

Due to the fact that the internal structures of the first part and the second part and especially the capillary structures may be connected to each other in a functional effective and continuous manner, the problem of breaking up the continuity of the vapor chamber can be circumvented effectively. Thus, starting from two individual parts does not raise any problems, but a vapor chamber which works effectively may be reached.

It was found that especially a method like described before, starting from two parts, connecting these parts by connecting elements, forming a capillary intermediate structure, such as on the connection, and closing the casing, such as particularly hermetically closing the casing, provides an effective way for forming the 3D-vapor chamber which is easy to handle and very reliable.

Further, it was found that by using a method as described before, the provision of outer cooling structures, i.e. cooling structures which are provided at the outside of the casing of the condenser, for example, may be enhanced. For example, air fins may be used as external cooling structures.

It was found that the choice of respective air fins may be taken very freely with regard to the design of the air fin, so that externally cooling the vapor chamber, such as externally cooling the condenser, may be realized in an especially effective manner. Therefore, the vapor chamber as such may cool adjacent parts, such as electronic parts, especially effectively, allowing a broad application range.

The provision of air fins can be enhanced, for example, as they can be subsequently provided to the finished structure comprising the first part and the second part. Thus, given the building space which is provided, the arrangement, i.e. the geometry as well as the size of the air fins is not limited, allowing a very high degree of freedom and thus a high cooling rate.

Therefore, it may further be provided that the method comprises the further step of: e) providing air fins adjacent to the first part. Like indicated above, the air fins can improve cooling of the condenser and may thus improve the working behaviour of the vapor chamber.

It may be provided, for example, that the air fins are provided by connecting respective parts to the casing. Especially, it may be provided that the air fins are attached to the casing by using laser welding. However, in order to provide air fins having an especially high cooling capacity due to optimized geometry, it may also be provided that air fins are formed by means of additive manufacturing.

It may be preferred that step e) is performed by using laser welding. Therefore, it is provided that closing the casing by connecting the casing of the first part with the casing of the second part by providing a closure is performed by means of laser welding. For example, laser metal deposition may be used for this step.

According to this embodiment, it may be allowed that the casing of the vapor chamber is hermetically closed, or hermetically sealed, respectively, in an effective manner and with a process which is easy to handle. Apart from that, by using laser welding, such as laser metal deposition, which is a process of additive manufacturing, the closure may be formed in a very defined and precise manner. Further, the closure may be formed very flexible and thus can be adapted to the desired needs and in particular to the capillary structure. This allows that the capillary structure of the first part, the second part and the capillary intermediate structure is not negatively affected. It can thus be allowed that continuity of the capillary structure is maintained. Therefore the condensed water can effectively be spread in the first part, allowing a very effective working behaviour of the formed vapor chamber.

It may further be provided that step d), and thus the step of closing the gap between the capillary structure of the first part and of the second part by forming a capillary intermediate structure between the capillary structure of the first part and of the second part is performed by performing selective laser sintering.

According to this embodiment, again, it may be allowed that by using a process of additive manufacturing, the capillary structure may be formed in a very defined and precise manner. Further, the intermediate structure may be formed in a very flexible manner and thus can be adapted to the desired needs and in particular to the capillary structure of the first part and of the second part. The capillary intermediate structure is thus very adaptive and can be tailored to the neighbouring structures so that the capillary structure of the first part, the second part and the capillary intermediate structure is continuous so the condensed water can effectively be spread in the second part, allowing a very effective working behaviour of the formed vapor chamber.

It may further be provided that the first part and the second part are connected to each other when being arranged perpendicular to each other.

According to this embodiment, a kind of "T"-structure may be formed by respectively positioning the first part and the second part. Thus, the evaporator may be arranged as a horizontal part whereas the condenser may be arranged as a vertical part. It was found that this embodiment allows a very effective working behaviour of the vapor chamber. This may be due to the fact, for example, air fins which serve for externally cooling the vapor chamber and thus for improving water in the vapor chamber to be condensed, may be formed especially adaptive and may further have a large contact area to the first part. Thus, cooling of the first part and thus condensing of water in the first part is enhanced.

It may further be provided that the first part is fixed to the second part in a central area with regard to the two-dimensional extension of the first part. This embodiment allows that water that condensed in the condenser and thus in the second part and which is transferred to the evaporator and thus to the first part through the capillary structure can be spread in the first part and thus in the evaporator very effectively. This allows a homogeneous cooling capacity of the vapor chamber and thus an improved applicability. In fact, hot spots of parts to be cooled can be avoided or at least significantly reduced.

A central area shall thereby be defined as a position in which the first part is fixed to the second part in an area which is provided in an exact central position with regard to the two-dimensional extension of the first part or having a deviation therefrom in a range of +/−10% with regard to the distance between the casing of the second part to the edges of the first part in the two-dimensional extension of the first part and thus in a plane proceeding perpendicular to the second part.

It may further be provided that the capillary structure of at least one of the first part and the second part is formed as a three-dimensional mesh. This embodiment allows the formation of a capillary structure which may effectively transport and guide the condensed water into the evaporator and may further effectively assist in water to be condensed. Thus, again, this embodiment helps the vapor chamber to work in a very efficient manner.

A three-dimensional mesh in the sense of the present invention may be a structure in which a strand is not only interwoven, or intermeshed, respectively, in a two-dimensional extension, but which structure is respectively intermeshed in a three-dimensional manner.

It should further be noted that a mesh according to the present invention is not strictly a structure which is formed of a strand being intermeshed, but such a structure may also be formed, for example, by additive manufacturing resulting in the same or a comparable structure.

It may further be provided that the capillary structure of at least one of the first part and the second part is formed from a material selected from the group consisting of copper and aluminum. It was found that these materials show synergistic effects in the properties as required. In detail such materials on the one hand allow an effective working behaviour of the vapor chamber and on the other hand may be processed in a very defined manner so that the provided structures in turn may have a very defined size and geometry.

With regard to further advantages and technical features of the method, it is referred to the vapor chamber, the figures and the further description.

Further described is a vapor chamber for dissipating heat from an electronic element, wherein the vapor chamber comprises a first part forming an evaporator, wherein the first part comprises a casing having an interior space in which a capillary structure for guiding liquid water and an inner volume for carrying water vapor is provided, and a second part forming a condenser, wherein the second part comprises a casing having an interior space in which a capillary structure for guiding liquid water and an inner volume for carrying water vapor is provided, wherein the first part is connected to the second part such, that the capillary structure of the first part is connected to the capillary structure of the second part by means of a capillary intermediate structure being connected to the capillary structure of the first part and the capillary structure of the second part, and wherein the casing of the vapor chamber is closed between the casing of the first part and the second part by means of a closure.

Such a vapor chamber may provide significant advantages over the prior art.

In detail, such a vapor chamber may be formed in a very defined and reliable manner. It may thus be provided that the vapor chamber has excellent cooling capacity.

Thus, the vapor chamber as described combines an improved manufacturing method with an improved working behaviour.

With regard to further advantages and technical features of the vapor chamber, it is referred to the method, the figures and the further description.

BRIEF DESCRIPTION OF DRAWINGS

These and other aspects of the invention will be apparent from and elucidated with reference to the embodiments described hereinafter. Individual features disclosed in the embodiments con constitute alone or in combination an aspect of the present invention. Features of the different embodiments can be carried over from one embodiment to another embodiment.

In the drawings.

DESCRIPTION OF EMBODIMENTS

Figure 1:
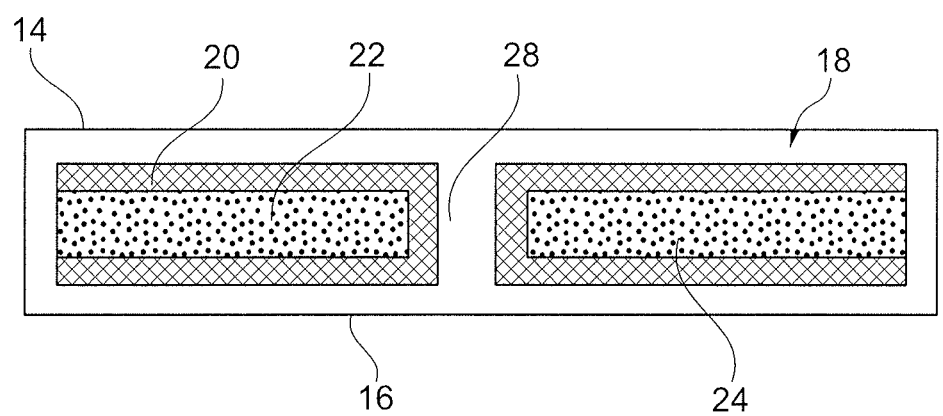
FIG. 1 shows a first step of forming a vapor chamber by using a method according to the invention.

FIG. 1 shows a first step of a method of forming a vapor chamber 10 for dissipating heat from an electronic component, the electronic component not shown as such in the figures. The method is suited for manufacturing a vapor chamber 10 which comprises a first part 12, wherein the first part 12 forms an evaporator, and wherein the vapor chamber 10 comprises a second part 14, wherein the second part 14 forms a condenser, wherein the first part 12 is fixed to the second part 14.

According to FIG. 1, a second part 14 is shown which may form a condenser. However, it has to be noted that a first part 12 may be formed correspondingly.

The second part 14 comprises a casing 16 having an interior space 18 in which a capillary structure 20 for guiding liquid water and an inner volume 22 for carrying water vapor 24 is provided.

Figure 2:
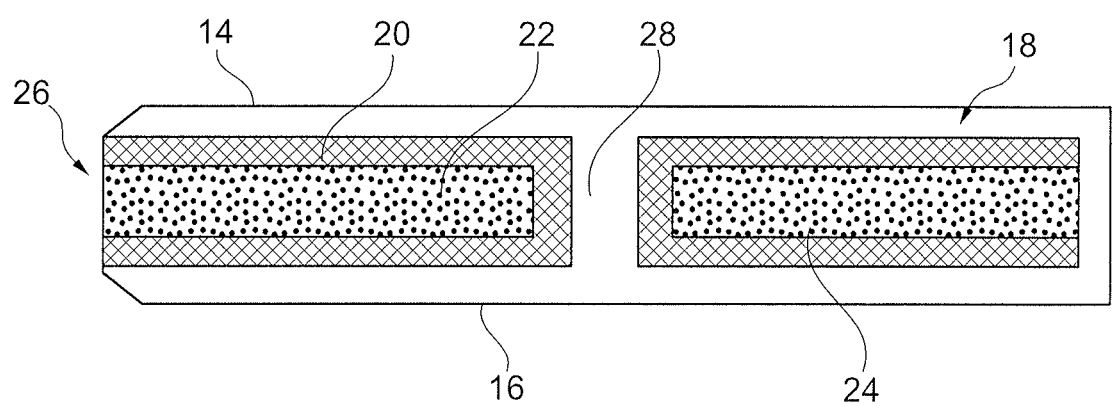
FIG. 2 shows a further step of forming a vapor chamber by using a method according to the invention.

The second part 14 is shown in FIG. 2 in which it is shown that the second part 14, or its casing 16, respectively, is provided with an opening 26 for connecting the interior space 18 of the second part 14 with the respective interior space 18 of the first part 12. Further, fixing bars 28 are shown which serve for mechanical stability. However, it has to be noted that the capillary structure 20 as well as the inner volume 22 is connected through the whole casing 16 or in other words, the fixing bars 28 do not form a separation between capillary structures 20 or inner volumes 22 being in the casing 16.

Figure 3:
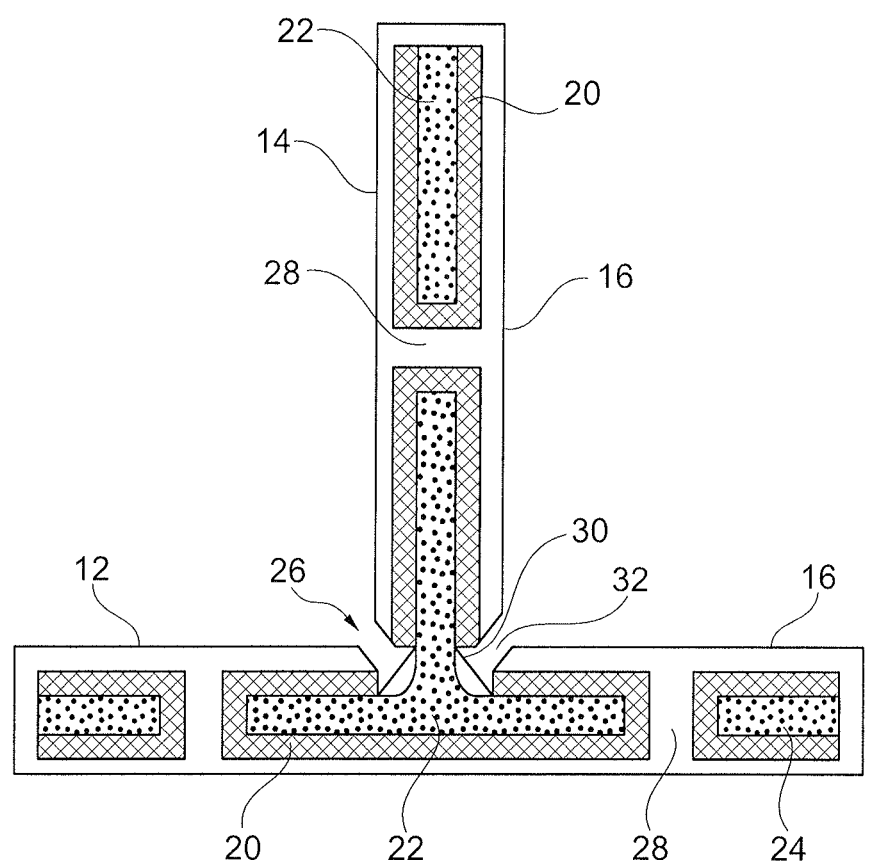
FIG. 3 shows a further step of forming a vapor chamber by using a method according to the invention.

FIG. 3 shows that additionally to the second part 14, a first part 12 for forming an evaporator is provided. Correspondingly to the second part 14, the first part 12 comprises a casing 16 having an interior space 18 in which a capillary structure 20 for guiding liquid water and an inner volume 22 for carrying water vapor is provided. Again, the first part 12 comprises an opening 26 which is provided for connecting the interior of the casing 16 with the interior of the casing 16 of the second part 14.

It can be seen that both in the first part 12 as well as in the second part 14, the capillary structure enclose the inner volume 22 so that water vapor which is present in the inner volume can condense in the capillary structure 20 at the outside of the inner volume 22.

Both the first part 12 and the second part 14 may be provided by forming a respective opening 26 in a conventional two-dimensional vapor chamber.

FIG. 3 further sows that the first part 12 is connected to the second part 14. This is realized by fixing a connecting element 30 to both the capillary structure 20 of the first part 12 and of the second part 14, thereby forming a gap 32 between the capillary structure 20 of the first part 12 and of the second part 14.

Like shown in FIG. 3, this step is particularly performed when the first part 12 and the second part 14 are arranged perpendicular to each other. Further, in a preferred embodiment and again as shown in FIG. 3, this step is performed such, that the first part 12 is fixed to the second part 14 in a central area with regard to the two-dimensional extension of the second part 14 and thus according to FIG. 3 in the horizontal plane. Therefore, shown are two areas of the capillary structures 20 of the first part 12 which each are connected to the respective area of capillary structures 20 of the second part 14 being arranged opposite to each other with regard to the opening 26. This allows that the final 3D-vapor chamber 10 as produced may have a capillary structure 20 which is continuous and forms a kind of frame around the inner volume 22 also in the area at which the first part 12 and the second part 14 are connected to each other in a T-like structure.

Figure 4:
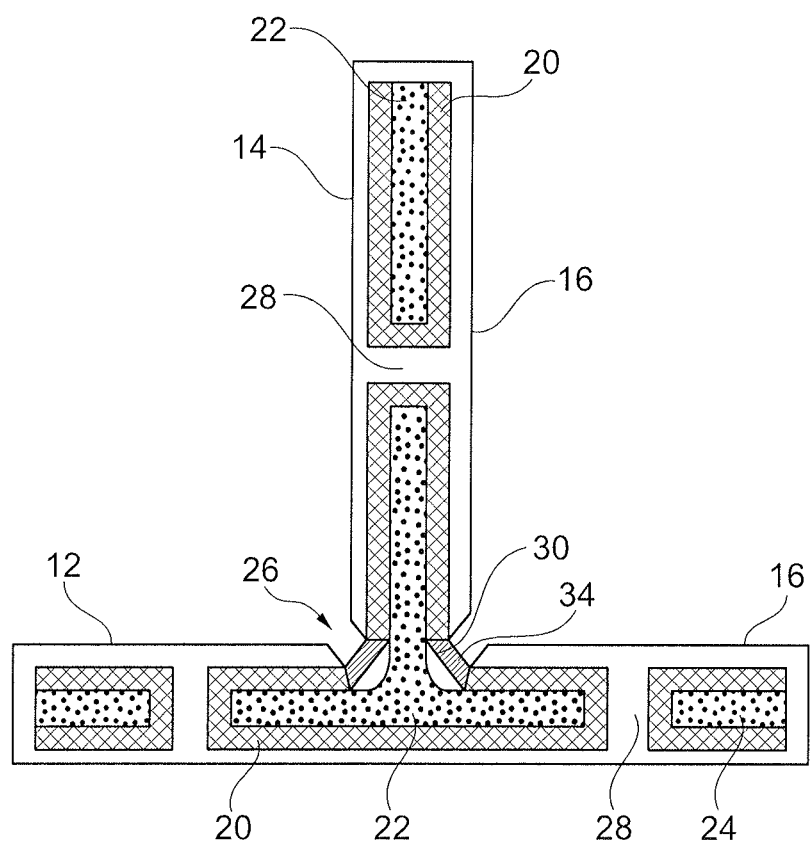
FIG. 4 shows a further step of forming a vapor chamber by using a method according to the invention.

This is shown in FIG. 4 in which a step is shown in which the gap 32 between the capillary structure 20 of the first part 12 and of the second part 14 is closed by forming a capillary intermediate structure 34 between the capillary structure 20 of the first part 12 and of the second part 14.

This step may be realized, for example by forming the capillary intermediate structure 34 onto the connecting element 30 and/or by means of selective laser sintering. As a result, continuity of the capillary structure 20 and thus of the respective capillary intermediate structure 34 is given.

Like described above, this step allows forming a capillary structure 20 which is continuous also at the area at which the first part 12 and the second part 14 are connected to each other.

Figure 5:
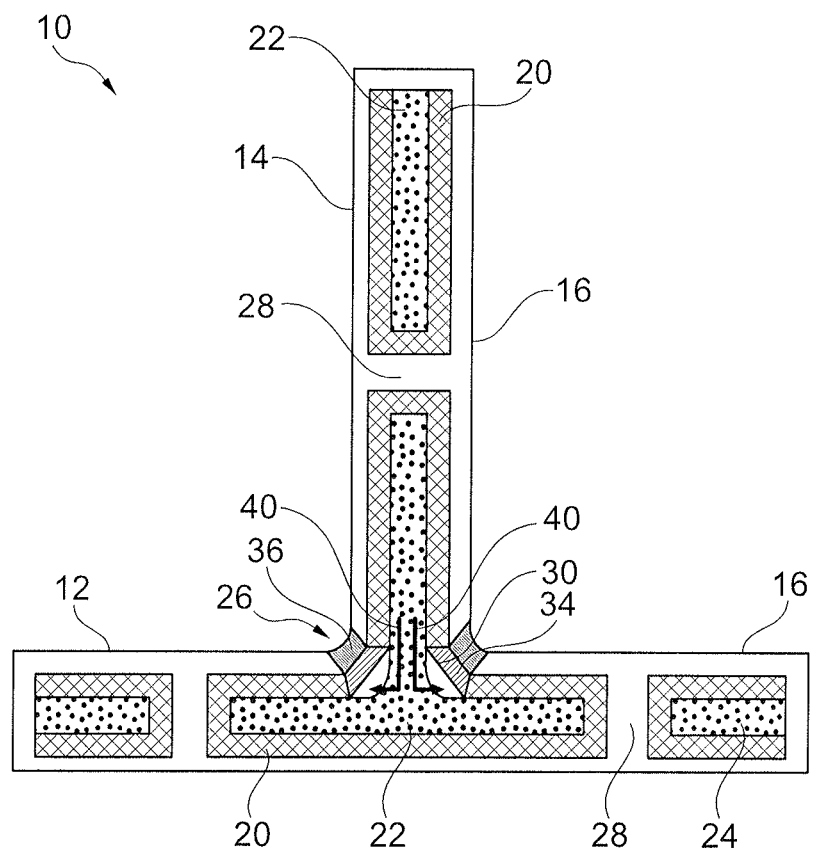
FIG. 5 shows a further step of forming a vapor chamber by using a method according to the invention.

FIG. 5 shows a further step of the method as described. According to FIG. 5, it is provided that the casing 16 is closed by connecting the casing 16 of the first part with the casing 16 of the second part by providing a closure 36.

This step allows hermetically closing the casing 16 such, that liquid water or water vapor are prevented from leaving the internal volume 18 and on the other side substances are prevented from entering the casing 16. For example, this step may be performed by means of laser welding. For example, a pre-fabricated closure may be positioned on the intermediate capillary structure 34 and may be welded to the abutting parts of the casing 16.

According to FIG. 5, the basic structure of the 3D-vapor chamber 10 comprising a condenser and an evaporator being arranged perpendicular to each other may be finished.

It can be seen, like indicated by arrows 40, that due to the continuity of the capillary structure 20, water which is condensed in the second part 14 can be spread horizontally in the first part 12 in all horizontal directions due to the guidance of the capillary structure of the capillary structure 20. Thus, the described method of forming a vapor chamber 10 allows an effective working behaviour of the vapor chamber.

In order to further improve the working behaviour of the vapor chamber 10, it is preferably provided that the method comprises the further step of providing air fins 38 adjacent to the second part 14 and thus adjacent to the condenser.

Figure 6:
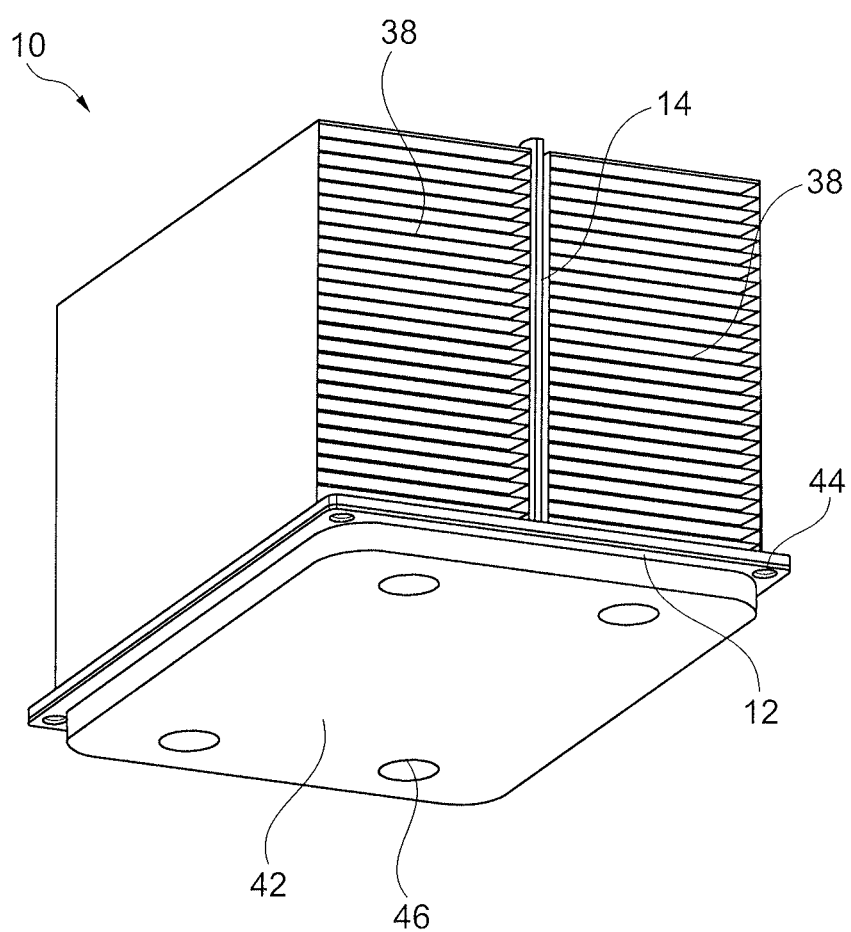
FIG. 6 shows a further step of forming a vapor chamber by using a method according to the invention.

A respective embodiment in which air fins 38 are provided is shown in FIG. 6. It can be seen that that adjacent to the second part 14 and at both opposite sides thereof, there is a large building space for forming the air fins 38. Thus, the air fins 38 may be formed in a very adaptable size and geometry which enhances the cooling behaviour and thus the cooling performance of the vapor chamber 10.

Further shown is a contact area 42 which might serve for contacting an electronic component to be cooled and thus or thermally coupling the electronic component and the vapor chamber 10 and thus its evaporator. The vapor chamber can be fixed to the electronic component, for example by means of screws by using holes 44, 46, for example.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

REFERENCE SIGNS LIST 10 vapor chamber
12 first part
14 second part
16 casing
18 interior space
20 capillary structure
22 inner volume
24 water vapor
26 opening
28 fixing bar
30 connecting element
32 gap
34 capillary intermediate structure
36 closure
38 air fin
40 arrow
42 contact area
44 hole
46 hole

The invention claimed is:

1. A method of forming a vapor chamber for dissipating heat from an electronic component, wherein the vapor chamber comprises a first part, wherein the first part forms an evaporator, and wherein the vapor chamber comprises a second part, wherein the second part forms a condenser, wherein the first part is fixed to the second part, and wherein the method comprises:

a) providing the first part for forming an evaporator, wherein the first part comprises a casing having an interior space in which a capillary structure for guiding liquid water and an inner volume for carrying water vapor is provided, and wherein the casing comprises an opening for connecting the interior space of the first part with an interior space of the second part;

b) providing the second part for forming a condenser, wherein the second part comprises a casing having an interior space in which a capillary structure for guiding liquid water and an inner volume for carrying water vapor is provided, and wherein the casing comprises an opening for connecting the interior space of the first part with the interior space of the second part;

c) connecting the second part to the first part by fixing a connecting element to both the capillary structure of the first part and of the second part, thereby forming a gap between the capillary structure of the first part and the second part;
d) closing the gap between the capillary structure of the first part and of the second part by forming a capillary intermediate structure between the capillary structure of the first part and of the second part; and
e) closing the casing of the vapor chamber by connecting the casing of the first part with the casing of the second part by providing a closure.

2. The method according to claim 1, wherein said closing the casing is performed by performing laser welding.

3. The method according to claim 2, wherein said closing the gap is performed by performing selective laser sintering.

4. The method according to claim 3, wherein the first part and the second part are connected to each other when being arranged perpendicular to each other.

5. The method according to claim 4, wherein the first part is fixed to the second part in a central area with regard to the two-dimensional extension of the first part.

6. The method according to claim 5, wherein the capillary structure of at least one of the first part and the second part is formed as a three dimensional mesh.

7. The method according to claim 6, wherein the capillary structure of at least one of the first part and of the second part is formed from a material selected from the group consisting of copper and aluminum.

8. The method according to claim 7, wherein the method further comprises providing air fins to the first part.

9. The method according to claim 8, wherein at least one of providing the first and providing the second part is performed by providing an opening in a two-dimensional vapor chamber.

10. The method according to claim 2, wherein at least one of providing the first part and providing the second part is performed by providing an opening in a two-dimensional vapor chamber.

11. The method according to claim 2, wherein the capillary structure of at least one of the first part and the second part is formed as a three dimensional mesh.

12. The method according to claim 1, wherein said closing the gap is performed by performing selective laser sintering.

13. The method according to claim 12, wherein the first part and the second part are connected to each other when being arranged perpendicular to each other.

14. The method according to claim 1, wherein the first part and the second part are connected to each other when being arranged perpendicular to each other.

15. The method according to claim 1, wherein the first part is fixed to the second part in a central area with regard to the two-dimensional extension of the first part.

16. The method according to claim 1, wherein the capillary structure of at least one of the first part and the second part is formed as a three dimensional mesh.

17. The method according to claim 1, wherein the capillary structure of at least one of the first part and of the second part is formed from a material selected from the group consisting of copper and aluminum.

18. The method according to claim 1, wherein the method further comprises providing air fins to the first part.

19. The method according to claim 1, wherein at least one of providing the first part and providing the second part is performed by providing an opening in a two-dimensional vapor chamber.

* * * * *